United States Patent
Anai et al.

(10) Patent No.: US 11,945,974 B2
(45) Date of Patent: Apr. 2, 2024

(54) COMPOSITION FOR PROVISIONAL FIXATION AND METHOD FOR PRODUCING BONDED STRUCTURE

(71) Applicant: Mitsui Mining & Smelting Co., Ltd., Tokyo (JP)

(72) Inventors: Kei Anai, Ageo (JP); Jung-Lae Jo, Ageo (JP); Kengo Tashiro, Ageo (JP)

(73) Assignee: Mitsui Mining & Smelting Co., Ltd. (JP)

( * ) Notice: Subject to any disclaimer, the term of this patent is extended or adjusted under 35 U.S.C. 154(b) by 0 days.

(21) Appl. No.: 17/770,658

(22) PCT Filed: Mar. 12, 2021

(86) PCT No.: PCT/JP2021/010126
§ 371 (c)(1),
(2) Date: Apr. 21, 2022

(87) PCT Pub. No.: WO2021/193150
PCT Pub. Date: Sep. 30, 2021

(65) Prior Publication Data
US 2022/0380639 A1    Dec. 1, 2022

(30) Foreign Application Priority Data
Mar. 27, 2020    (JP) .................. 2020-058980

(51) Int. Cl.
*C09J 11/06*    (2006.01)
*H01L 23/00*    (2006.01)

(52) U.S. Cl.
CPC ............... *C09J 11/06* (2013.01); *H01L 24/27* (2013.01); *H01L 2224/27436* (2013.01); *H01L 2224/29293* (2013.01); *H01L 2224/293* (2013.01)

(58) Field of Classification Search
CPC ............... C09J 11/06; H01L 24/27; H01L 2224/27436; H01L 2224/29293;
(Continued)

(56) References Cited

U.S. PATENT DOCUMENTS

| 5,976,302 A | 11/1999 | Oppermann et al. |
| 2013/0105558 A1 | 5/2013 | Abe et al. |

(Continued)

FOREIGN PATENT DOCUMENTS

| EP | 4144808 A1 | 3/2023 |
| JP | 2000-049450 A | 2/2000 |
| JP | 2012-033518 A | 2/2012 |
| JP | 2012-126802 A | 7/2012 |
| JP | 2012126802 A * | 7/2012 |

(Continued)

OTHER PUBLICATIONS

International Search Report (in English and Japanese) issued in PCT/JP2021/010126, dated Jun. 15, 2021; ISA/JP (6 pages).

*Primary Examiner* — Daniel H Lee
(74) *Attorney, Agent, or Firm* — Harness, Dickey & Pierce, P.L.C.

(57) ABSTRACT

A temporary fixing composition is provided that is used to temporarily fix a first bonding target material and a second bonding target material to each other before the two bonding target materials are bonded to each other. The temporary fixing composition contains a first organic component having a viscosity of less than 70 mPa·s at 25° C. and a boiling point of 200° C. or lower and a second organic component having a viscosity of 70 mPa·s or greater at 25° C. and a boiling point of 210° C. or higher. It is preferable that, when thermogravimetry-differential thermal analysis is performed under the conditions at a temperature increase rate of 10° C./min in a nitrogen atmosphere with a sample mass of 30 mg, the 95% mass reduction temperature is lower than 300° C.

11 Claims, 1 Drawing Sheet

(58) Field of Classification Search
CPC ... H01L 2224/293; H01L 24/29; H01L 24/05; H01L 24/32; H01L 2224/04026; H01L 2224/05639; H01L 2224/2732; H01L 2224/27848; H01L 2224/29294; H01L 2224/29347; H01L 2224/2949; H01L 2224/29499; H01L 2224/32227; H01L 2224/32245; H01L 2224/83002; H01L 2224/83055; H01L 2224/83065; H01L 2224/83075; H01L 2224/83192; H01L 2224/83203; H01L 2224/83385; H01L 2224/8384; H01L 2224/83907; H01L 24/83; H01L 21/52; H01L 24/28; H01L 2224/2929

See application file for complete search history.

(56) References Cited

U.S. PATENT DOCUMENTS

| | | |
|---|---|---|
| 2018/0247884 A1 | 8/2018 | Hasegawa et al. |
| 2021/0242165 A1 | 8/2021 | Mita et al. |

FOREIGN PATENT DOCUMENTS

| | | | |
|---|---|---|---|
| JP | 2016-066765 A | | 4/2016 |
| JP | 2016066765 A | * | 4/2016 |
| JP | 2018-137375 A | | 8/2018 |
| JP | 2020-045514 A | | 3/2020 |
| WO | 2019-093427 A1 | | 5/2019 |
| WO | 2019-208072 A1 | | 10/2019 |

* cited by examiner

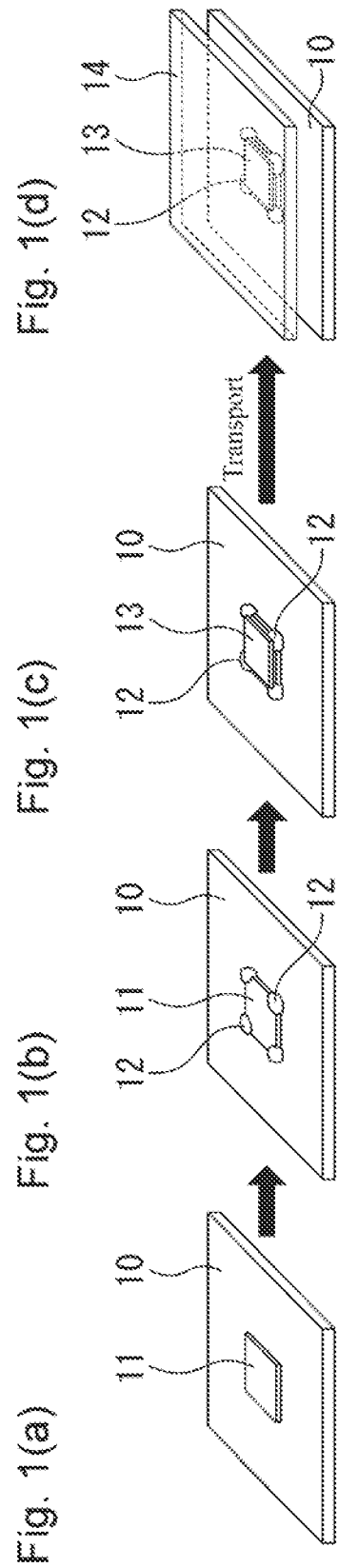

COMPOSITION FOR PROVISIONAL FIXATION AND METHOD FOR PRODUCING BONDED STRUCTURE

CROSS REFERENCE TO RELATED APPLICATIONS

This application is a U.S. National Phase Application under 35 U.S.C. 371 of International Application No. PCT/JP2021/010126, filed on Mar. 12, 2021, which claims priority to Japanese Patent Application No. 2020-058980, filed on Mar. 27, 2020. The entire disclosures of the above applications are expressly incorporated by reference herein.

BACKGROUND

Technical Field

The present invention relates to a composition used to temporarily fix two bonding target materials to each other before the two materials are bonded to each other. The present invention also relates to a method for producing a bonded structure using the composition.

Related Art

Conventionally, solder has been used as a material for connecting a semiconductor element to a substrate such as a circuit board or a ceramic substrate or a wiring body such as a lead frame. Solder is originally an alloy that contains lead, which is an environmentally damaging substance, and with the recent increase in environmental awareness, various types of lead-free solder that do not contain lead have been proposed.

Meanwhile, recently, semiconductor devices called power devices have become increasingly widely used as power conversion/control devices such as inverters. Unlike integrated circuits such as memories and microprocessors, power devices are used to control high current, and therefore generate a very large amount of heat when operating. For this reason, the solder used to mount a power device is required to be heat resistant. However, the lead-free solder mentioned above has the drawback of being less heat-resistant than ordinary lead-containing solder.

To address this issue, various techniques have been proposed in which, instead of solder, a paste containing metal microparticles is used, and the paste is applied to an object using any of various coating means and fired. For example, US 2018/247884A1 discloses a method in which a paste containing silver particles is disposed between a semiconductor chip and a chip mounting part, and the semiconductor chip is bonded to the chip mounting part via a sintered body of the silver particles. In this method, a temporarily fixing agent having tackiness is supplied such that it has a portion that is in contact with the chip mounting part, and the semiconductor chip is mounted on the paste such that a portion of an under surface of the semiconductor chip comes into contact with the temporarily fixing agent.

With the technique disclosed in US 2018/247884A1, the temporarily fixing agent disposed on the chip mounting part and the paste containing silver particles may come into contact with each other. In that case, depending on the type of component contained in the temporarily fixing agent, the properties of the paste containing silver particles may be changed. This can be a cause of a problem in bonding between the semiconductor chip and the chip mounting part. Therefore, it is an object of the present invention to provide a temporary fixing composition that can be used to successfully bond bonding target materials to each other via a bonding material without affecting the properties of the bonding material, and a method for producing a bonded structure using the composition.

SUMMARY

The present invention provides a temporary fixing composition including: a first organic component having a viscosity of less than 70 mPa·s at 25° C. and a boiling point of 200° C. or lower; and a second organic component having a viscosity of 70 mPa·s or greater at 25° C. and a boiling point of 210° C. or higher, wherein the temporary fixing composition is used to temporarily fix a first bonding target material and a second bonding target material to each other before the first and second bonding target materials are bonded to each other.

BRIEF DESCRIPTION OF THE DRAWINGS

FIGS. 1(a) to 1(d) are schematic diagrams sequentially illustrating a process of bonding two bonding target materials to each other using a temporary fixing composition of the present invention.

DETAILED DESCRIPTION

The present invention relates to a temporary fixing composition. The temporary fixing composition is used to temporarily fix a first bonding target material and a second bonding target material to each other before the two bonding target materials are bonded (i.e., permanently fixed) to each other. The temporarily fixed first and second bonding target materials are bonded to each other in the next step, for example, a sintering step to thereby form a bonded structure.

"Temporary fixing" means a mode of fixation in which the first bonding target material and the second bonding target material are fixed to each other and, even though the fixed state will change if a large external force is applied, the fixed state will not be changed by a small external force (e.g., a force of such magnitude that causes, when a temporarily fixed product of the first bonding target material and the second bonding target material is placed with surfaces to be bonded of the two bonding target materials extending in the vertical direction, either the first bonding target material or the second bonding target material to fall off under its own weight).

There is no particular limitation on the types of the first bonding target material and the second bonding target material. In general, it is preferable that both of the first and second bonding target materials contain a metal in their surfaces to be bonded to each other. For example, a member having a surface made of a metal can be used as at least one of the first bonding target material and the second bonding target material. Also, a dried product of a paste containing metal microparticles and an organic solvent can be used as at least one of the first bonding target material and the second bonding target material. Specifically, it is possible to use a member having a surface made of a metal as the first bonding target material and use a dried product of a paste containing metal microparticles and an organic solvent as the second bonding target material. Note that, in the case where a dried product of a paste is used, it is preferable to obtain the dried product by coating the paste onto a support base material made of a metal, such as copper, and drying the paste.

Note that, if the above-mentioned "dried product of a paste containing metal microparticles and an organic solvent" is heated in the next step, for example, the metal microparticles contained in the dried product are sintered together, and for this reason, the dried product can be regarded as a sintering precursor. Therefore, in the present description, the "dried product of a paste containing metal microparticles and an organic solvent" will hereinafter also be referred to as a "sintering precursor".

In the case where the first bonding target material is constituted by a member having a surface made of a metal and the second bonding target material is constituted by a sintering precursor, the metal of the first bonding target material and the metal of the metal microparticles of the second bonding target material may be of the same type or of different types. The term "metal" as used herein means a metal itself that does not form a compound with another element, or an alloy of two or more metals. There is no particular limitation on the type of metal, but considering that the temporary fixing composition of the present invention is to be used in combination with a bonding member that is substituted for solder, it is advantageous to use a metal that has a higher melting point than the melting point of solder. Examples of such metal include copper, silver, gold, aluminum, titanium, nickel, or a combination of two or more thereof.

In the case where at least one of the first bonding target material and the second bonding target material is a member having a surface made of a metal, the surface made of a metal may be composed of one metal, or two or more metals. In the case where the surface made of a metal is composed of two or more metals, this surface may be made of an alloy. In general, the surface made of a metal is preferably a flat surface; however, in certain cases, the surface made of a metal may be a curved surface.

In the case where at least one of the first bonding target material and the second bonding target material is a sintering precursor, the sintering precursor is made of a dried product that is obtained from a coating film of a paste containing metal microparticles and an organic solvent by volatilizing and removing the organic solvent from the coating film.

The metal microparticles contained in the paste may be composed of one metal, or an alloy of two or more metals. Moreover, the metal microparticles may be composed of a mixture of two or more different types of metal microparticles.

From the viewpoint of keeping the first bonding target material and the second bonding target material in a well bonded state, it is preferable that the volume-based cumulative particle size $D_{SEM50}$ of the metal microparticles is from 0.01 to 30 µm. From the same viewpoint, the volume-based cumulative particle size $D_{SEM50}$ of the metal microparticles is more preferably from 0.03 to 20 µm, and even more preferably from 0.05 to 15 µm.

The volume-based cumulative particle size $D_{SEM50}$ can be measured in the following manner, for example. With the use of Mac-View manufactured by Mountech Co., Ltd., an SEM image of the metal microparticles is loaded, then, fifty or more metal microparticles in the SEM image are randomly chosen, and the particle size (Heywood diameter) of each particle is measured. Subsequently, based on the obtained Heywood diameter, the volume of each particle is calculated assuming that the particle is a perfect sphere, and, regarding the thus calculated volumes, the volume-based cumulative particle size $D_{SEM50}$ at a cumulative volume of 50 vol % is obtained.

The shape of the metal microparticles is not particularly limited, and may be a spherical shape, a polyhedral shape, a flat shape, an irregular shape, or a combination of these, for example. Moreover, the metal microparticles may have two or more peaks in a particle size distribution thereof.

A surface treating agent may be attached to the surface of the metal microparticles. When the surface treating agent is attached to the surface of the metal microparticles in advance, excessive aggregation of the metal microparticles can be suppressed.

There is no particular limitation on the surface treating agent, and a fatty acid, an aliphatic amine, a silane coupling agent, a titanate-based coupling agent, an aluminate-based coupling agent, or the like can be used. When such a surface treating agent is used, the surface treating agent interacts with the surface of the particles, thereby improving the compatibility of the particles with the organic solvent contained in the paste, and thus, the fluidity of the paste can be improved. Also, oxidation of the surface of the particles can be prevented.

The paste and the sintering precursor, which is a dried product of the paste, may contain a regulator for adjusting various properties of the paste or the sintering precursor. Examples of the regulator include a solid reducing agent, a viscosity modifier, and a surface tension regulator.

The solid reducing agent is preferably one that exhibits the properties of a solid at 25° C. and exhibits a reducing effect, and examples thereof include bis(2-hydroxyethyl)iminotris(hydroxymethyl)methane, trimethylolpropane, ribitol, glucose, ascorbic acid, and hydroquinone.

The viscosity modifier may be any viscosity modifier that can adjust the viscosity of the paste, and examples thereof include ketones, esters, alcohols, glycols, hydrocarbons, and polymers.

The surface tension regulator may be any surface tension regulator that can adjust the surface tension of the paste, and examples thereof include polymers, such as acrylic surfactants, silicone-based surfactants, alkylpolyoxyethylene ethers, and fatty acid glycerol esters, and monomers, such as alcohol-based monomers, hydrocarbon-based monomers, ester-based monomers, and glycols.

The above-mentioned sintering precursor is made of a dried product that is obtained from a coating film of a paste containing metal microparticles and an organic solvent, and a regulator if necessary, by volatilizing and removing the organic solvent from the coating film. However, it is not necessary to remove the entire amount of the organic solvent; it is sufficient that the organic solvent is removed to such an extent that the coating film of the paste loses its fluidity. Accordingly, the organic solvent may remain in the sintering precursor. The ratio of the organic solvent contained in the sintering precursor can be 15 mass % or less, and particularly 10 mass % or less, for example.

There is no particular limitation on the type of the organic solvent, and any organic solvent in which the metal microparticles can be dispersed to form a paste can be used. Examples of the organic solvent include monoalcohols, polyhydric alcohols, polyhydric alcohol alkyl ethers, polyhydric alcohol aryl ethers, esters, nitrogen-containing heterocyclic compounds, amides, amines, and saturated hydrocarbons. One of these organic solvents may be used alone, or two or more thereof may be used in combination.

As the monoalcohols, for example, 1-propanol, 1-butanol, 1-pentanol, 1-hexanol, cyclohexanol, 1-heptanol, 1-octanol, 1-nonanol, 1-decanol, glycidol, benzyl alcohol, methylcyclohexanol, 2-methyl-1-butanol, 3-methyl-2-butanol, 4-methyl-2-pentanol, 2-propanol, 2-ethylbutanol, 2-ethylhexanol, 2-octanol, 2-methoxyethanol, 2-ethoxyethanol, 2-n-butoxyethanol, 2-phenoxyethanol, terpineol, and the like can be used.

As the polyhydric alcohols, ethylene glycol, propylene glycol, 1,3-propanediol, 1,4-butanediol, 1,5-pentanediol, diethylene glycol, dipropylene glycol, triethylene glycol, tetraethylene glycol, hexylene glycol, polyethylene glycol, and the like can be used.

As the polyhydric alcohol alkyl ethers, ethylene glycol monomethyl ether, ethylene glycol monoethyl ether, ethylene glycol monobutyl ether, diethylene glycol monomethyl ether, diethylene glycol monoethyl ether, diethylene glycol monobutyl ether, triethylene glycol monomethyl ether, triethylene glycol monoethyl ether, propylene glycol monobutyl ether, and the like can be used.

As the polyhydric alcohol aryl ethers, ethylene glycol monophenyl ether and the like can be used. As the esters, ethyl cellosolve acetate, butyl cellosolve acetate, γ-butyrolactone, and the like can be used. As the nitrogen-containing heterocyclic compounds, N-methylpyrrolidone, 1,3-dimethyl-2-imidazolidinone, and the like can be used. As the amides, formamide, N-methylformamide, N,N-dimethylformamide, and the like can be used. As the amines, monoethanolamine, diethanolamine, triethanolamine, tripropylamine, tributylamine, and the like can be used. As the saturated hydrocarbons, for example, heptane, octane, nonane, decane, undecane, dodecane, tridecane, tetradecane, pentadecane, hexadecane, and the like can be used.

In the present invention, a bonded structure is produced by temporarily fixing the first bonding target material and the second bonding target material to each other with the temporary fixing composition disposed therebetween and bonding the temporarily fixed two bonding target materials to each other. It is preferable that components of the temporary fixing composition are selected in relation to the type of the organic solvent contained in the paste used to form the sintering precursor and the type of the surface treating agent attached to the surface of the metal microparticles contained in the paste.

It is preferable that the temporary fixing composition contains an organic compound (hereinafter this organic component will be referred to as a "first organic component") having a viscosity of less than 70 mPa·s at 25° C. and a boiling point of 200° C. or lower and an organic compound (hereinafter this organic component will be referred to as a "second organic component") having a viscosity of 70 mPa·s or greater at 25° C. and a boiling point of 210° C. or higher.

In the present invention, it is preferable that the first organic component contained in the temporary fixing composition does not change the condition of the dried product of the paste, that is, the sintering precursor at 25° C., and it is more preferable that all the organic components contained in the temporary fixing composition do not change the condition of the dried product at 25° C. When such an organic component is contained in the temporary fixing composition, the sintering precursor is unlikely to deteriorate during temporary fixation of the first bonding target material and the second bonding target material with the temporary fixing composition disposed therebetween, and the two bonding target materials can be reliably temporarily fixed to each other.

The wording "does not change the condition of the dried product" as used in the present invention means that, when 1 μl of the organic component is added dropwise onto the dried product and dried under the conditions at 110° C. or lower, no change is confirmed in the dried product before and after the addition of the organic component when observed under a microscope at a magnification of 140×. The meaning of the wording "no change is confirmed" involves not only a situation in which no change is observed in the dried product before and after the addition of the organic solvent, but also a situation in which no trace of the addition of the organic solvent can be seen in an ultrasonic flaw detection image after bonding.

Moreover, it is preferable that the first organic component constituting the temporary fixing composition is a liquid component that is slightly soluble in the organic solvent contained in the paste and/or the surface treating agent of the metal microparticles contained in the paste. Here, the term "liquid component" means a component that is liquid at 25° C. The degree of the slight solubility of the liquid component can be quantitatively expressed as follows: it is preferable that, when 1 g of the organic solvent, 1 g of the regulator, or 1 g of the surface treating agent and 9 g of the first organic component, which is the liquid component, are mixed at 25° C., a liquid-liquid interface is observed therebetween, or a precipitate is observed in the mixed liquid. With such a liquid component contained in the temporary fixing composition, when the first bonding target material and the second bonding target material are brought into contact with each other via the temporary fixing composition and temporarily fixed to each other, the properties of the first bonding target material and/or the second bonding target material are unlikely to be affected by the temporary fixing composition. In particular, in the case where the first bonding target material and/or the second bonding target material is a sintering precursor, the properties of the sintering precursor are unlikely to be affected by the temporary fixing composition. As a result, it is possible to reliably temporarily fix the first bonding target material and the second bonding target material to each other and thereby reliably bond the two bonding target materials to each other.

It is preferable that the first organic component constituting the temporary fixing composition is an organic component with which the above-mentioned liquid-liquid interface is observed or the precipitate is observed, and it is more preferable that all the organic components constituting the temporary fixing composition are organic components with which the above-mentioned liquid-liquid interface is observed or the precipitate is observed.

The wording "a liquid-liquid interface is observed therebetween" as used in the present invention means that, when 1 g of the organic solvent, 1 g of the regulator, or 1 g of the surface treating agent and 9 g of the liquid component are placed into a test tube at 25° C., mixed for 10 minutes using a test tube mixer, and then allowed to stand at 25° C. for 5 minutes, the organic solvent, regulator, or surface treating agent and the liquid component separate from each other, and an interface therebetween is observed.

Moreover, the wording "a precipitate is observed in the mixed liquid" as used in the present invention means that, when, similarly, 1 g of the organic solvent, 1 g of the regulator, or 1 g of the surface treating agent and 9 g of the liquid component are placed into a test tube at 25° C., mixed for 10 minutes using a test tube mixer, and then allowed to stand at 25° C. for 5 minutes, a precipitate of one of the organic solvent, regulator, or surface treating agent and the liquid component is observed in a liquid phase of the other.

The first organic component contained in the temporary fixing composition is a substance that is unlikely to deteriorate the first bonding target material and the second bonding target material when these bonding target materials are temporarily fixed to each other and that is easily volatilizable while the two bonding target materials are in the temporarily fixed state.

The viscosity of the first organic component at 25° C. is more preferably 50 mPa·s or less, and even more preferably 40 mPa·s or less. Also, the boiling point of the first organic component is more preferably 195° C. or lower, and even more preferably 190° C. or lower.

The viscosity is a value at 100/s that is measured by changing a sensor applied (parallel plates or the like) as appropriate in accordance with the viscosity estimated using a rheometer (hereinafter, the term "viscosity" means a value that is measured in this manner).

It is preferable that the amount of the first organic component contained in the temporary fixing composition is from 1 to 70 mass %, because in this case the temporarily fixed state of the first bonding target material and the second bonding target material can be reliably maintained, and the first bonding target material and the second bonding target material in the temporarily fixed state are unlikely to be deteriorated. For these reasons, the amount of the first organic component contained in the temporary fixing composition is more preferably from 1 to 70 mass %, even more preferably from 1 to 50 mass %, and yet even more preferably from 1 to 30 mass %.

As the first organic component, any organic component that does not change the condition of the sintering precursor can be used as described above, and examples thereof are similar to those listed above as examples of the organic solvent and include monoalcohols, polyhydric alcohols, polyhydric alcohol alkyl ethers, polyhydric alcohol aryl ethers, esters, nitrogen-containing heterocyclic compounds, amides, amines, saturated hydrocarbons, terpene alcohols, ketones, and carboxylic acids. One of these organic components may be used alone, or two or more thereof may be used in combination.

It is preferable that the temporary fixing composition contains, in addition to the first organic component, a second organic component that is of a different type than the first organic component. Preferably, the second organic component is a highly viscous compound. Specifically, it is preferable that, in a state in which the first bonding target material and the second bonding target material are temporarily fixed to each other, the second organic component can remain between the first bonding target material and the second bonding target material even after the first organic component has been removed from the temporary fixing composition through volatilization and can maintain the temporarily fixed state of the two bonding target materials due to its viscosity. From the viewpoint of achieving this advantage even more markedly, it is more preferable that the second organic component has a viscosity of 70 mPa·s or greater at 25° C., and the viscosity may even be infinite. This means that the second organic component may be solid at 25° C. Moreover, the boiling point of the second organic component is preferably 210° C. or higher, and more preferably 220° C. or higher.

It is also preferable that the second organic component can be removed by heat when bonding the first bonding target material and the second bonding target material to each other through heating. The meaning of the wording "can be removed by heat" involves a case in which the second organic component is volatilized and removed by heat and a case in which the second organic solvent is decomposed and removed by heat. In this context, it is preferable that the second organic component is a monomer with a relatively low molecular weight. Specifically, the molecular weight of the second organic component is preferably 1,000 or less, more preferably 800 or less, and even more preferably 600 or less.

It is preferable that the amount of the second organic component contained in the temporary fixing composition is from 30 to 99 mass %, because in this case the temporarily fixed state of the first bonding target material and the second bonding target material can be reliably maintained. For a similar reason, the amount of the second organic component contained in the temporary fixing composition is more preferably from 50 to 99 mass %.

The mass ratio of the first organic component to the second organic component is preferably 1:99 to 70:30, more preferably 3:97 to 60:40, and even more preferably 5:95 to 50:50.

Organic components similar to those listed above as examples of the first organic component can be used as the second organic component. Among such organic components, in particular, glycerin (boiling point: 290° C.), 1,2,4-butanetriol (boiling point: 312° C.), 4-(1'-acetoxy-1'-methylethyl)-cyclohexanol acetate (boiling point: 223° C.), isobornyl cyclohexanol (boiling point: 313° C.), and the like are preferably used. Moreover, as the second organic component that is solid at 25° C., for example, borneol (boiling point: 213° C.), 2,4,6-triisopropyl-1,3,5-trioxane (boiling point: 244° C.), trimethylolpropane (boiling point: 295° C.), myristyl alcohol (boiling point: above 260° C.), 2,4-diethyl-1,5-pentanediol (boiling point: 264° C.), and the like are preferably used. One of these compounds may be used alone, or two or more thereof may be used in combination.

Since the temporary fixing composition is used for temporary fixation until the first bonding target material and the second bonding target material are completely fixed to each other through sintering, it is preferable that, after the sintering, the temporary fixing composition does not remain between the two bonding target materials to an extent possible so that the bonded structure to be obtained is prevented from being unintentionally affected by the temporary fixing composition. For this purpose, when the temperature of the temporary fixing composition is raised from 25° C. to 40° C. at a temperature increase rate of 2° C./min in a nitrogen stream and kept for 20 minutes, and the temporary fixing composition is then subjected to thermogravimetry-differential thermal analysis under the conditions at a temperature increase rate of 10° C./min in a nitrogen atmosphere (e.g., in a nitrogen stream) with a sample mass of 30 mg, the 95% mass reduction temperature is preferably lower than 300° C., more preferably 290° C. or lower, and even more preferably 270° C. or lower.

In addition to the first organic component and the second organic component that have been described above, the temporary fixing composition may also contain other components as long as the effects of the present invention are not inhibited. With regard to the ratio of the other components in the temporary fixing composition, the total amount of the other components is preferably 5 mass % or less, and more preferably 3 mass % or less, with respect to the temporary fixing composition.

It is preferable that the temporary fixing composition is substantially free of an organic polymer compound. In general, organic polymer compounds are nonvolatile or slightly volatile substances, and therefore, if an organic polymer compound is contained in the temporary fixing composition, there is a possibility that the organic polymer compound or a compound derived therefrom will remain between the first bonding target material and the second bonding target material after the two bonding target materials are completely fixed to each other through sintering. Such a compound may have an unintentional adverse effect on the bonded structure to be obtained. For this reason, it is preferable that the temporary fixing composition is substantially free of an organic polymer compound. For a similar reason, it is also preferable that the temporary fixing composition is substantially free of an inorganic compound. The wording "substantially free of an organic polymer compound" means that an organic polymer compound is not intentionally contained in the temporary fixing composition, but inevitable contamination of the temporary fixing composition with an organic polymer compound is acceptable. The wording "substantially free of an inorganic compound" also has a similar meaning.

Examples of the above-mentioned organic polymer compound include: polyolefins such as polyethylene, polypropylene, and ethylene-α-olefin copolymers; polyesters such as polyethylene terephthalate and polybutylene terephthalate; vinyl polymers such as polyvinyl chloride and polystyrene; (meth)acrylic acid-based polymers such as poly(meth)acrylic acid and polyalkyl (meth)acrylate; terpene-based polymers such as polyethylene glycol, terpene polymers, and terpenephenol polymers; and polycarbonate and polyether sulfone.

Next, a method of using the temporary fixing composition of the present invention will be described.

FIGS. 1(a) to 1(d) schematically illustrate a process of bonding a first bonding target material and a second bonding target material to each other using the temporary fixing composition. First, as illustrated in FIG. 1(a), a paste containing metal microparticles and an organic solvent is applied onto a substrate 10 to form a coating film thereon, the organic solvent is then removed from the coating film, and thus, a sintering precursor, which is a dried product of the paste, or in other words, a second bonding target material 11 is formed. FIG. 1(a) illustrates a state in which a single sintering precursor serving as the second bonding target material 11 is formed on the surface of a single substrate 10. The substrate 10 may be made of, for example, a metal such as copper, silver, nickel, gold or aluminum, or a ceramic such as alumina, silicon carbide, silicon nitride or aluminum nitride. Moreover, metal plating, or a metal pattern, of copper, silver, nickel, gold, aluminum, or the like may also be formed on one side or both sides of the metal or the ceramic.

Subsequently, as illustrated in FIG. 1(b), a temporary fixing composition 12 is provided on the surface of the second bonding target material 11. The temporary fixing composition 12 may be provided on only a portion of the second bonding target material 11 (e.g., corner portions of the sintering precursor 11) as illustrated in FIG. 1(b), or may be provided over the entire region of the second bonding target material 11. To provide the temporary fixing composition 12, a known method, such as dispensing, pin transferring, inkjet printing, or screen printing, for example, can be employed.

Subsequently, as illustrated in FIG. 1(c), a first bonding target material 13 is superposed on the second bonding target material 11. A surface of the first bonding target material 13 that faces the second bonding target material 11 is made of a metal. The temporary fixing composition 12 is disposed between the two bonding target materials 11 and 13 as a result of the first bonding target material 11 being superposed on the second bonding target material 13. Since the temporary fixing composition 12 preferably does not contain a component that changes the condition of the sintering precursor, which is the second bonding target material 11, the shape of the second bonding target material 11 is stably maintained. Moreover, since the temporary fixing composition 12 preferably contains a highly viscous component, the temporarily fixed state of the two bonding target materials 11 and 13 is stably maintained.

Next, the temporarily fixed bonding target materials 11 and 13 are heated. Due to the heating, the metal microparticles contained in the second bonding target material 11, or the sintering precursor, are sintered, and the two bonding target materials 11 and 13 are thus bonded to each other. FIG. 1(d) illustrates this step. Since heating is usually performed in a furnace (not shown), the temporarily fixed bonding target materials 11 and 13 shown in FIG. 1(c) are transported from a stage shown in FIG. 1(c) to a heating stage by a transporting means (not shown). Since the bonding target materials 11 and 13 are reliably fixed to each other by the temporary fixing composition 12, the bonding target materials 11 and 13 can be effectively prevented from becoming misaligned during transportation. As a result, in the furnace, the bonding target materials 11 and 13 are reliably bonded to each other at an original planned bonding position.

When heating the bonding target materials 11 and 13, pressure may be applied thereto using a pressure member 14. In particular, in the case where the first bonding target material 13 is a semiconductor power device, it is necessary to increase the reliability of bonding between the first bonding target material 13 and the second bonding target material 11, and therefore, there are cases where the pressure member 14 is used in order to form a dense sintered structure. If the pressure member 14 is used, the bonding target materials 11 and 13 in the temporarily fixed state are likely to become misaligned; however, since the bonding target materials 11 and 13 are temporarily fixed to each other using the temporary fixing composition 12 of the present invention, the bonding target materials 11 and 13 are unlikely to become misaligned even when pressure is applied to the bonding target materials 11 and 13 using the pressure member 14.

In order to reliably bond the bonding target materials 11 and 13 to each other, the pressure applied by the pressure member 14 during heating is preferably from 1 to 40 MPa. The heating temperature is preferably from 200° C. to 300° C. Heating at this temperature enables the metal microparticles in the sintering precursor, which is the second bonding target material 11, to be reliably sintered and the temporary fixing composition 12 to be removed by heat. With regard to the sintering atmosphere, any of an oxygen-containing atmosphere such as atmospheric air, an inert atmosphere such as nitrogen, and a hydrogen-containing atmosphere can be used.

As described above, the present invention also provides use of a composition to temporarily fix a first bonding target material and a second bonding target material to each other before the first and second bonding target materials are bonded to each other, the composition including a first organic component having a viscosity of less than 70 mPa·s at 25° C. and a boiling point of 200° C. or lower and a second organic component having a viscosity of 70 mPa·s or greater at 25° C. and a boiling point of 210° C. or higher.

EXAMPLES

Hereinafter, the present invention will be described in greater detail using examples. However, the scope of the present invention is not limited to the examples below. Unless otherwise specified, "%" means "mass %".

Example 1

(1) Preparation of Temporary Fixing Composition

Decane (having a viscosity of 0.7 mPa·s at 25° C. and a boiling point of 174° C.) was used as a first organic component. 2,4,6-Triisopropyl-1,3,5-trioxane (being solid at 25° C. and having a boiling point of 244° C.) was used as a second organic component. The first and second organic components were mixed to prepare a temporary fixing composition. In the temporary fixing composition, the concentration of the first organic component was 70%, and the concentration of the second organic component was 30%. The temporary fixing composition was free of an organic polymer compound and an inorganic compound.

Confirmation of Mass Reduction Temperature of Temporary Fixing Composition

The temperature of the temporary fixing composition was raised to 40° C. at a temperature increase rate of 2° C./min in a nitrogen stream and kept for 20 minutes, and after that, thermogravimetry-differential thermal analysis was performed on the temporary fixing composition under the conditions at a temperature increase rate of 10° C./min in a nitrogen stream with a sample mass of 30 mg using an apparatus for simultaneous differential thermal analysis and thermogravimetric analysis, TG-DTA2000SA, manufactured by Bruker AXS, and the 95% mass reduction temperature was found to be 152° C.

(2) Preparation of Bonding Paste

Two types of copper particles (spherical particles with $D_{SEM50}=0.14$ μm and flake-shaped particles with $D_{SEM50}=4.7$ μm) synthesized using a wet method, hexylene glycol and PEG 300 serving as organic solvents, and other regulators such as a solid reducing agent were mixed to prepare a bonding paste. Bis(2-hydroxyethyl)iminotris(hydroxymethyl)methane (hereinafter also referred to as "BIS-TRIS") was used as the solid reducing agent.

In the bonding paste, the ratio of the copper particles was 74%, the ratio of hexylene glycol was 23.4%, and the ratio of PEG 300 was 0.74%. The spherical particles accounted for 30% of the copper particles, and the flake-shaped particles accounted for 70% of the copper particles. The ratio of BIS-TRIS used as the solid reducing agent was 1.85%.

Confirmation of Change in Condition of Dried Product

The bonding paste was applied, through screen printing, onto a substrate made of oxygen-free copper to form a rectangular coating film with a size of 1 cm×1 cm. The coating film was dried at 110° C. for 20 minutes to remove the organic solvent, and thus, a dried product was formed. After that, 1 μl of decane, which was the first organic component of Example 1, was added dropwise onto the dried product, and the state thereof was immediately checked under a microscope at a magnification of 140×. The result was that a change in the condition of the dried product before and after the addition of decane was not observed.

When 1 g of PEG 300, which was the organic solvent contained in the bonding paste, and 9 g of decane, which was the first organic component of the temporary fixing composition, were mixed at 25° C. and allowed to stand, phase separation occurred between PEG 300 and decane, and a liquid-liquid interface was observed therebetween.

When 1 g of BIS-TRIS, which was the solid reducing agent contained in the bonding paste, and 9 g of decane, which was the first organic component of the temporary fixing composition, were mixed at 25° C. and allowed to stand, phase separation occurred between BIS-TRIS and decane, and a solid-liquid interface was observed therebetween.

(3) Formation of Second Bonding Target Material Constituted by Sintering Precursor The bonding paste was applied, through screen printing, onto a substrate made of a copper plate (20 mm×20 mm, thickness: 0.5 mm) to form a rectangular coating film with a size of 0.6 cm×0.6 cm. The coating film was dried at 110° C. for 20 minutes to remove the organic solvent, and thus, a second bonding target material constituted by a sintered precursor, which was the dried product, was formed.

(4) Superposition of First Bonding Target Material

An Ag-plated alumina chip (0.5 cm×0.5 cm, thickness: 0.5 mm) was provided as a model member of a semiconductor power device. This alumina chip was used as a first bonding target material. A few drops of the temporary fixing composition were added onto the entire surface of the sintering precursor formed in (3) above. Subsequently, the alumina chip was superposed on the sintering precursor, and a load of 0.8 MPa was applied thereto for 2 seconds.

Evaluation of Tackiness

After the superposition of the alumina chip, the bonded body was placed upright so that surfaces to be bonded to each other of the copper plate and the alumina chip extended in the vertical direction, and was then returned to horizontal. This operation was performed a total of 6 times at intervals of 10 minutes. During all of the 6 cycles of operation, the alumina chip did not come off the copper plate, and the tackiness was ensured.

Example 2

A temporary fixing composition was prepared using, instead of 2,4,6-triisopropyl-1,3,5-trioxane used as the second organic component in (1) Preparation of Temporary Fixing Composition of Example 1, 4-(1'-acetoxy-1'-methylethyl)-cyclohexanol acetate (being liquid at 25° C. and having a viscosity of 77 mPa·s at 25° C. and a boiling point of 223° C.) in a mass ratio to decane, which was used as the first organic component, of 1:99. Otherwise, production was performed by following a similar procedure to that of Example 1 up to (4) Superposition of First Bonding Target Material of Example 1.

The above-described evaluation of tackiness was performed on the substrate produced in Example 2, and the alumina chip did not come off even after 60 minutes. Therefore, it was found that tackiness was ensured. Furthermore, evaluation of bonding was performed, and the position of the chip did not become misaligned.

When the temporary fixing composition was subjected to thermogravimetry-differential thermal analysis under similar conditions to those of Example 1, the 95% mass reduction temperature was 233° C.

Comparative Example 1

A temporary fixing composition was prepared without using 2,4,6-triisopropyl-1,3,5-trioxane, which was used as the second organic component in (1) Preparation of Temporary Fixing Composition of Example 1. Otherwise, a similar procedure to that of Example 1 was performed up to (4) Superposition of First Bonding Target Material of Example 1. The above-described evaluation of tackiness was performed on the substrate produced, and the alumina chip came off after 20 minutes. Accordingly, it was found that tackiness was not ensured.

Comparative Example 2

A temporary fixing composition was prepared using camphor (being solid at 25° C. and having a boiling point of 204° C.) instead of 2,4,6-triisopropyl-1,3,5-trioxane used as the second organic component in (1) Preparation of Temporary Fixing Composition in Example 1. Otherwise, a similar procedure to that of Example 1 was performed up to (4) Superposition of First Bonding Target Material of Example 1. The above-described evaluation of tackiness was performed on the substrate produced, and the alumina chip came off after 20 minutes. Accordingly, it was found that tackiness was not ensured.

INDUSTRIAL APPLICABILITY

According to the present invention, when bonding target materials are to be bonded to each other using a bonding material, it is possible to temporarily fix the bonding target materials to each other while minimizing a change in the properties of the bonding material.

The invention claimed is:

1. A temporary fixing composition comprising:
a first organic component having a viscosity of 40 mPa·s or less at 25° C. and a boiling point of 200° C. or lower; and
a second organic component having a viscosity of 70 mPa·s or greater at 25° C. and a boiling point of 210° C. or higher,
wherein the temporary fixing composition is used to temporarily fix a first bonding target material and a second bonding target material to each other before the first bonding target material and the second bonding target material are bonded to each other, and
the temporary fixing composition is substantially free of an organic polymer compound.

2. The temporary fixing composition according to claim 1, wherein the first organic component does not change condition of the second bonding target material at 25° C.

3. The temporary fixing composition according to claim 1, wherein at least one of the first bonding target material and the second bonding target material is a dried product of a paste containing metal microparticles, an organic solvent, and a regulator, and
when 1 g of the organic solvent, 1 g of a surface treating agent attached to the metal microparticles, or 1 g of the regulator and 9 g of the first organic component in the temporary fixing composition are mixed at 25° C., a liquid-liquid interface is observed therebetween, or a precipitate is observed in a mixed liquid.

4. The temporary fixing composition according to claim 1, wherein a mass ratio of the first organic component to the second organic component is 1:99 to 70:30.

5. The temporary fixing composition according to claim 1, wherein, when thermogravimetry-differential thermal analysis is performed under conditions at a temperature increase rate of 10° C./min in a nitrogen atmosphere with a sample mass of 30 mg, a 95% mass reduction temperature is lower than 300° C.

6. The temporary fixing composition according to claim 1, wherein the first organic component is a liquid at 25° C.

7. The temporary fixing composition according to claim 1, wherein the second organic component includes at least one selected from the group consisting of:
glycerin,
1,2,4-butanetriol,
4-(1'-acetoxy-1-methylethyl)-cyclohexanol acetate,
isobornyl cyclohexanol,
borneol,
2,4,6-triisopropyl-1,3,5-trioxane,
trimethylolpropane,
myristyl alcohol, and
2,4-diethyl-1,5-pentanediol.

8. The temporary fixing composition according to claim 1, wherein the first organic component includes saturated hydrocarbons.

9. The temporary fixing composition according to claim 1, wherein the first organic component includes decane.

10. A method for producing a bonded structure, the method comprising:
temporarily fixing a first bonding target material and a second bonding target material to each other with a temporary fixing composition disposed between the first bonding target material and the second bonding target material; and
firing the temporarily fixed bonding target materials to thereby bond the bonding target materials to each other,
wherein, the temporary fixing composition includes:
a first organic component having a viscosity of 40 mPa·s or less at 25° C. and a boiling point of 200° C. or lower; and
a second organic component having a viscosity of 70 mPa·s or greater at 25° C. and a boiling point of 210° C. or higher,
wherein the temporary fixing composition is substantially free of an organic polymer compound.

11. The method according to claim 10, wherein at least one of the first bonding target material and the second bonding target material is constituted by a sintering precursor that is a dried product of a paste containing metal microparticles and an organic solvent.

* * * * *